United States Patent [19]
Nauerth

[11] Patent Number: 5,557,203
[45] Date of Patent: * Sep. 17, 1996

[54] MAGNETIC RESONANCE IMAGING WITH COMBINED BACK PROJECTION AND FOURIER TRANSFORMATION METHOD

[75] Inventor: Arno Nauerth, Erlenbach, Germany

[73] Assignee: Bruker Medizintechnik GmbH, Germany

[*] Notice: The term of this patent shall not extend beyond the expiration date of Pat. No. 5,510,710.

[21] Appl. No.: 351,717

[22] Filed: Dec. 8, 1994

[30] Foreign Application Priority Data

Dec. 16, 1993 [DE] Germany .................. 43 43 023.6

[51] Int. Cl.$^6$ .................................................. G01R 33/40
[52] U.S. Cl. .................................................. 324/309
[58] Field of Search .................. 324/309, 307, 324/300, 314; 128/653.2

[56] References Cited

U.S. PATENT DOCUMENTS

| | | | |
|---|---|---|---|
| 4,307,343 | 12/1981 | Likes | 324/307 |
| 4,706,026 | 11/1987 | Pelc et al. | 324/309 |
| 5,087,880 | 2/1992 | Bruder et al. | 324/309 |
| 5,122,747 | 6/1992 | Riederer et al. | 324/309 |
| 5,243,284 | 9/1993 | Noll | 324/309 |
| 5,262,725 | 11/1993 | Cuppen et al. | 324/309 |
| 5,304,931 | 4/1994 | Flamig et al. | 324/309 |
| 5,349,294 | 9/1994 | Kasuboski | 324/309 |
| 5,361,028 | 11/1994 | Kanayama et al. | 324/309 |

FOREIGN PATENT DOCUMENTS

| | | | |
|---|---|---|---|
| 4219610 | 1/1994 | Germany | G01N 24/08 |
| 4232731 | 4/1994 | Germany | G01N 24/08 |

OTHER PUBLICATIONS

Kashmar, G. C. et al.: Fast NMR Imaging by Concentric Sampling, in: IEEE Transactions on Nuclear Science, vol. 33, No. 1, 1986, pp. 560–564.

Ortendahl, D. A. et al.: A Comparison of the Noise Characteristics of Projection Reconstruction and Two–Dimensional Fourier Transformations in NMR Imaging, in: IEEE Transactions of Nuclear Science, vol. N5–30, No. 1, 1983, pp. 692–696.

Nauerth, A. et al.: SPI–Single Point FID Imaging. In: 12th Annual Scientific Meeting der SMRM, Aug. 1993, New York, Contributions p. 1215.

Morris, P. G.: Nuclear Magnetic Resonance Imaging in Medicine and Biology, Oxford Science Publications, Clarendon Press, Oxford, 1986, § 4.1.

Webb et al, "A Fast Spectroscopic Imaging Method Using a Blipped Phase Encode Gradient"; Mag. Res. in Med. vol. 12 No. 3, pp. 306–315 (1989).

Primary Examiner—Sandra L. O'Shea
Assistant Examiner—Raymond Y. Mah
Attorney, Agent, or Firm—Walter A. Hackler

[57] ABSTRACT

A method for the production of a two or three-dimensional image with the assistance of magnetic resonance. The measuring data are taken according to the projection method by means of a sequential rotation of projection gradients. The image, however, is generated with 2dFT or 3dFT methods. The projection gradient is advantageously not only rotated between high frequency excitation pulses, but its strength is also changed in such fashion that the measuring points in k-space lie on squares or parallelepipeds.

11 Claims, 5 Drawing Sheets

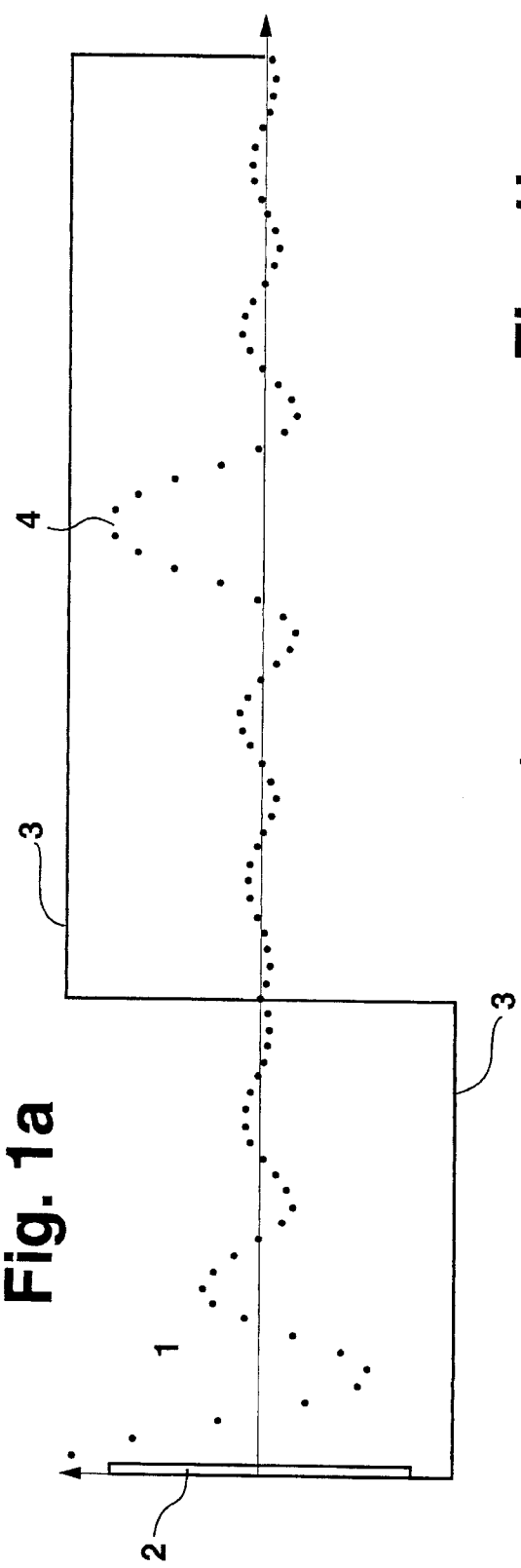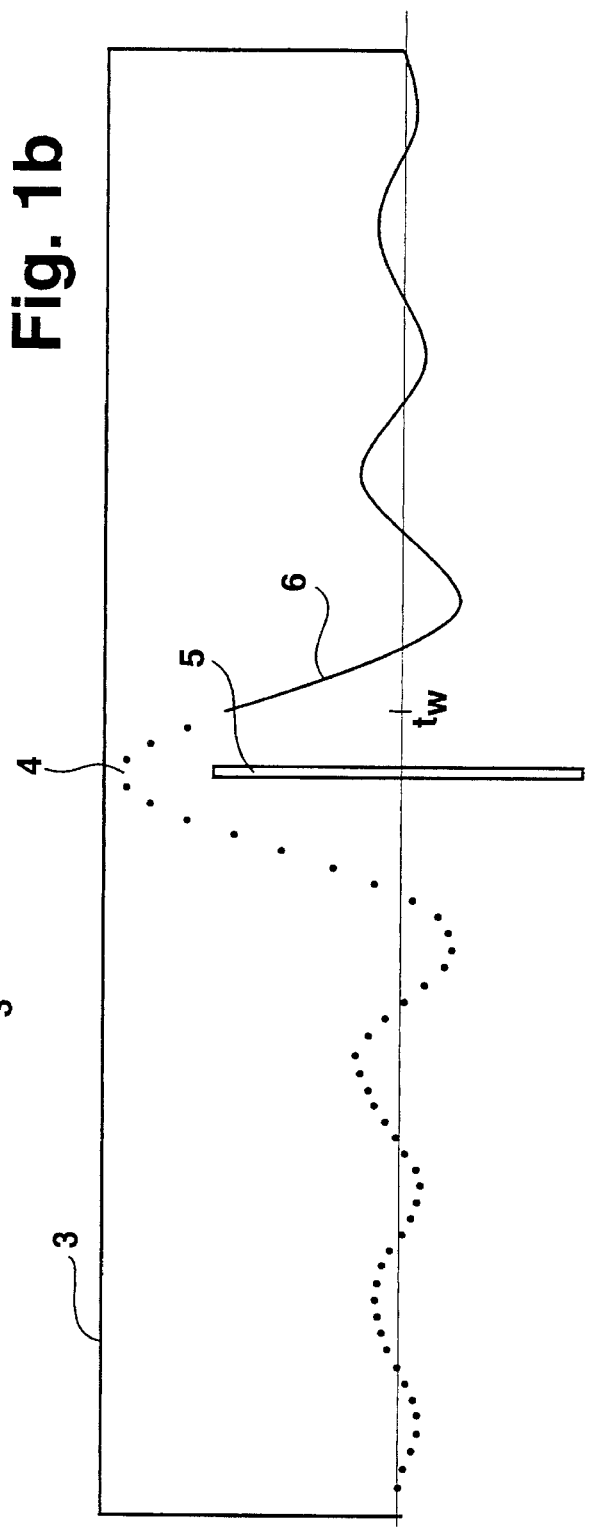

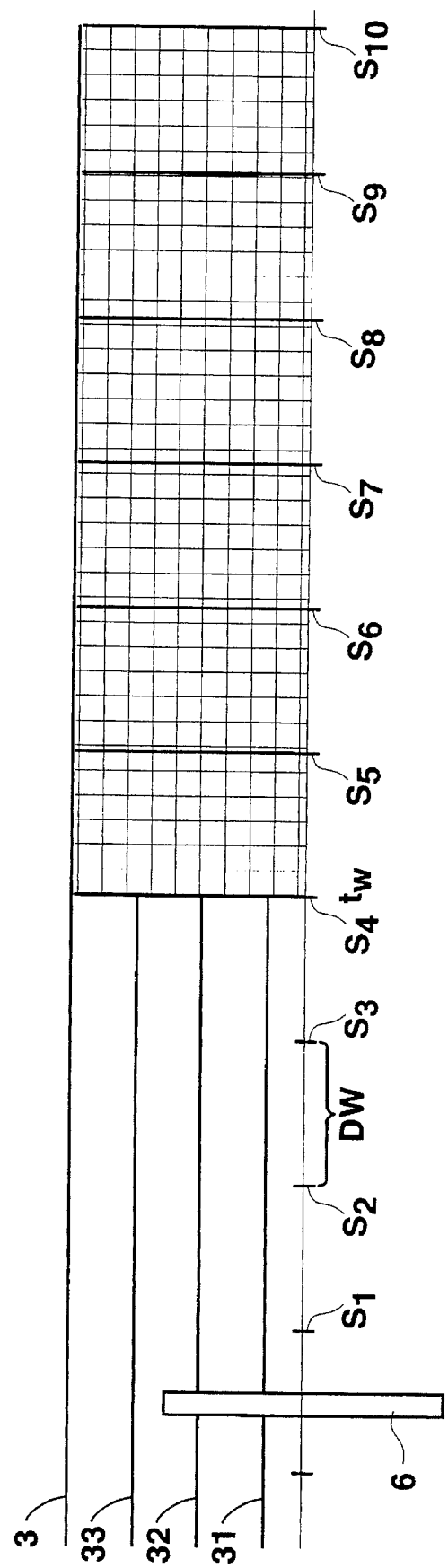

MAGNETIC RESONANCE IMAGING WITH COMBINED BACK PROJECTION AND FOURIER TRANSFORMATION METHOD

BACKGROUND OF THE INVENTION

The invention concerns a magnetic resonance imaging method with which an image of an object under investigation, which is located in a homogeneous base magnetic field, is taken with which, for taking a single projection, a gradient magnetic field with a predetermined direction $\phi$ and strength $G\phi$ is applied, a high frequency excitation pulse is irradiated and, with a predetermined sampling rate i (i>>1), sequential measuring points $S_j$ of a nuclear resonance signal from the object under investigation which dephases under the influence of the gradient magnetic field $G\phi$ are subsequently measured which correspond to i points in k-space lying along a vector extending from the origin whose direction is determined by the direction $\phi$ of the gradient magnetic field, whereby, in k-space, the separation of each of the j-measuring points from the origin is given by the integral of the gradient magnetic field over the time interval between the excitation pulse and the taking of the jth-measuring point $S_j$ and, for further n−1 (n>>1) projections, the direction and/or strength of the gradient magnetic field is changed and the excitation, and measurement are repeated (n−1) times, whereby the image of the object under investigation is constructed from the n*i measuring points of all n projections according to a reconstruction algorithm.

A method of this type is, for example, known to those of skill in the art as the so-called projection reconstruction method (back projection) and now constitutes basic knowledge in the area of magnetic resonance (see for example the textbook "Nuclear Magnetic Resonance Imaging in Medicine and Biology" by P. G. Morris, Oxford Science Publications, Clarendon Press, Oxford, 1986, § 4.1).

A method is known in the art from the article "SPI-Single Point FID Imaging" by A. Nauerth and B. Gewiese, conference contribution to the 12$^{th}$ Annual Scientific meeting of SMR, 14th–20th Aug. 1993, New York, p. 1215, with which precisely one measuring point is taken after each high frequency excitation so that each point in k-space corresponds to one excitation ("Single Point Imaging"=SPI). The applicant's subsequently published German patent applications P 42 9 610.8, P 42 32 731.8 as well as P 43 34 038.5 likewise concern the so-called "SPI method" or variations thereof.

In the conventional imaging method the measurement signals are generally taken by measuring and digitizing a spin echo or a gradient echo signal subsequent to the high frequency excitation. Since one first allows the NMR signal to dephase following excitation and to rephase with the assistance of a 180° pulse or through gradient inversion, one avoids the problem that, directly following excitation, the receiver is overloaded and a certain minimum amount of time $t_w$ must be waited before switching from transmission to reception. For this reason, with the original signal (FID), the initial measuring points of the NMR signal are not accessible to measurement. However, neglecting this signal portion would lead to enormous base line problems when Fourier transforming which renders good image reconstruction impossible. The echo signal solution is an elegant one and has significant advantages. However, this method increases the time interval between excitation and the taking of data which, in particular with investigational objects having short relaxation times $T_2$, limits its applicability. Towards this end, the SPI method offers an alternative with which one can work with the shortest of intervals. However, this advantage is at the extreme expense of the total measuring time, since each single point in k-space must be measured individually. This cannot, in particular, be tolerated with three dimensional objects and/or biological or living samples.

A widely used alternative to the above mentioned back projection method which is likewise well known to those of skill in the art is the so-called 2dFT or 3dFT method with which the direction of a projection gradient is not changed rather, in addition to a read gradient, one or two changeable phase gradients are applied in the intervals between excitation and the taking of data. These methods, among others, are, for example, compared to each other in the textbook "Principles of Nuclear Magnetic Resonance Microscopy" by P. T. Callagahn, Clarendon Press Oxford, 1991, chapter 3. The Fourier methods have the advantage that k-space is evenly filled by the measuring points which accelerates the reconstruction of images from the measuring data (this is particularly important in the three-dimensional case) and, in general, leads to artifact free images. On the other hand the simple turning of a gradient with constant magnitude is often an experimentally more simpler method and can, in fact, be replaced with the rotation of a sample in a fixed gradient. In particular with the production of three-dimensional images it is important that Fourier method imaging, in particular with installations without array processors, is much faster than the back projection method. It can be carried out currently in acceptable times using installations which are only equipped with a PC. A three-dimensional back projection image (128*128*128 imaging points) requires, in this case, more than one hour. This cannot be tolerated in most cases.

It is therefore the object of the present invention to present a method which combines the advantages of the back projection method and those of the Fourier method with acceptable total measuring times including image reconstruction.

SUMMARY OF THE INVENTION

This purpose is achieved by means of a method in which new measuring points are determined from the n*i measuring points to form an even square or cubic grid in k-space and image construction is carried out based on these new measuring points with the assistance of a 2d- or 3d-Fourier transformation algorithm.

Since one works with the projection method when taking data the advantages of same can be maintained. By means of the image production with the assistance of the 2-d or, in particular, the 3d-method one therefore surprisingly combines the advantages of the Fourier method. In this fashion the disadvantages of both methods are largely avoided.

In one embodiment, the gradient fields are changed in order to produce a two-dimensional image in such a fashion that all measuring points lie on concentric circles in k-space for correspondence, from the recording point of view, with the conventional projection method for two dimensions.

In a preferred improvement the gradient magnetic fields are changed in such a fashion that all measuring points in k-space lie on rectangles, preferentially on concentric squares. This simplifies the transition to new measuring points on a rectangular grid in k-space. This is accomplished by not only changing the direction of the gradient field between excitations, which is standard, but also its strength.

In one embodiment for the production of a three-dimensional image, the gradient magnetic fields are changed in such a fashion that all measuring points in k-space lie on concentric spherical shells which, from the recording perspective, precisely corresponds to the conventional projection method for three dimensions. Towards this end the direction of the gradient field must clearly not only be changed in a plane but rather in space to consequently result in a substantial increase in the number of projections.

In a preferred improvement the gradient fields are changed in such a fashion that all measuring points in k-space lie on cylinder surfaces which are nested within each other, in particular on the surfaces of cubes. This simplifies the transition to new measuring points on a rectangular grid in three dimensional k-space.

The assignment of the originally measured measuring points to the new ones which are adapted to the Fourier method advantageously transpires in that the two or three-dimensional k-space is subdivided within a rectangular or a parallelepiped-shaped measuring region into equally sized rectangles or parallelepipeds each of whose centers is assigned to a new measuring point. In this fashion a new measuring point grid results from which a two or three-dimension image of the object can be directly produced by means of two or threedimensional Fourier transformation.

In a particularly preferred embodiment the new measuring points are given by the measuring points within the corresponding rectangle or parallelepiped which lie most closely to the corresponding center and are set equal to zero when no measuring point is located in the corresponding rectangle or parallelepiped.

This method is particularly fast and simple. "Empty" rectangles or parallelepipeds only occur in the border regions at large values of k, where the signal strength is, in any event, already small. The neglect of overabundance of measuring points in the corresponding squares or parallelepipeds in the vicinity of the origin (k=0), where, in the projection method, the measuring point density is very high, can likewise, be generally tolerated without any problem.

In a further improvement the new measuring points are, in each case, given by an average value of all the points lying the corresponding rectangle or square and are set equal to zero when no measuring point is located in this corresponding rectangle or square.

This measure improves the signal to noise ratio.

In a still more precise but somewhat more difficult embodiment, the new measuring points each result from an average value weighted with the distance from the center of all of the measuring points lying in the corresponding rectangle or square and are set equal to zero when no measuring point is located in the corresponding rectangle or parallelepiped.

In principle the new measuring points can be extracted by weighted averages over an arbitrarily predetermined number of neighboring original measuring points. In this fashion even originally empty regions can be assigned new measuring points (deviating from zero). In practice one must decide between difficulty and improvement in quality.

Instead of a simple or weighted average the new measuring points can also be obtained in that one extracts a plausible dependence from the old measuring points, or a reasonable profile of the entire signal is fitted in the time or k-space domain and the values of the new measuring points are determined at their positions in k-space.

In a preferred improvement of the method, the gradient strengths and directions are adjusted in such a fashion that each rectangular edge or each parallelepiped edge within the rectangular- shaped or parallelepiped-shaped measuring region in k-space contains at least, preferentially precisely one, measuring point. This avoids "empty" regions and assures that at least one original measuring point is available for each new measuring point.

It is preferred when the measuring points of the nuclear magnetic resonance signal are recorded with a quadrature detector, e.g. real and imaginary parts or magnitudes and phase of the complex signals are recorded.

Further advantages of the invention result are given in the description and the accompanying drawing. The above mentioned features as well as those to be described further below can be utilized in accordance with the invention individually or collectively in arbitrary combination. The embodiments and variations of the method in accordance with the invention mentioned are not to be considered as exhaustive enumeration, have rather exemplary character only.

The invention is represented in the drawing and will be more closely described and explained in concrete examples.

BRIEF DESCRIPTION OF THE DRAWING

FIG. 1a shows the time development of an NMR signal following an excitation pulse with gradient inversion (gradient echo), FIG. 1b shows the time dependence of an NMR signal after an excitation pulse, with constant gradient, complemented to negative times, whereby the measurable portion is indicated by heavy lines;

FIG. 2 shows a representation of the completion of missing measuring points which occur in the waiting time interval $t_w$ following the excitation pulse by means of subsequent measurements with reduced gradient strength at, in each case, time point $t_{w'}$.

DESCRIPTION OF THE PREFERRED EMBODIMENT

Figure 3:
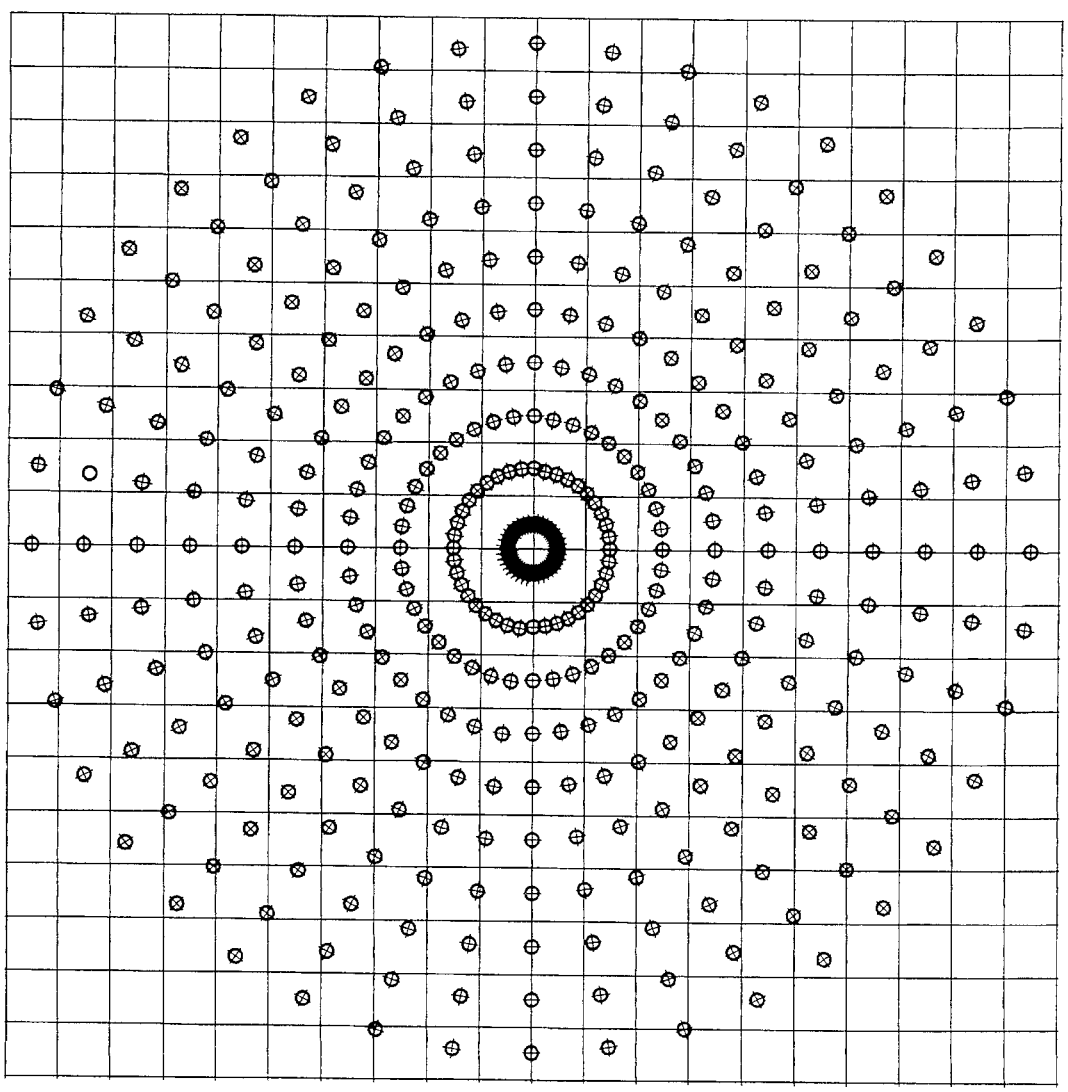
FIG. 3 shows a representation of the position of the measuring points in two-dimensional k-space.

FIG. 1a shows, in detail, the time dependence of the NMR signal 1 after a high frequency excitation pulse 2 with the production of a spin echo by means of a switched gradient 3. The excitation pulse is, in general, a 90° pulse can, however, also have smaller flip angles. The signal 1 dephases initially under the action of the negative gradient 3 and is rephased by gradient reversal, so that a signal maximum 4 occurs which is symmetric to the signal 1 in the vicinity of the positive gradient 3. Both sides of the echoes can be measured for purposes of analysis or only one can be measured and the other symmetrically complemented. Measurements precisely at the maximum present no difficulties. The per se symmetric dependence of the signal 1 is overlapped with an exponential decay due to $T_2$ relaxation (not shown here). In order to reconstruct an image using the Projection-Reconstruction method, a plurality of such signals dependences (projections) are taken with different gradient directions, further processed, according to prior art with the projection reconstruction algorithm, and subsequently imaged.

FIG. 1b reproduces the initial dependence of the signal of FIG. 1a for positive gradients 3 in an enlarged representation. It is, however, also possible to interpret the figure differently. A high frequency pulse 5 is drawn precisely at the point of time of the signal maximum 4 which can be conceptualized as an excitation pulse. The portion of the signal adjacent thereto in time then represents a free induction decay (FID) due to the excitation pulse 5. The preceding time portion now has, at best, only a theoretical significance. It does not exist as a real signal. The portion 6 of the signal 1 which is measurable is drawn as a heavy line. It begins after the waiting time $t_w$. Although the signal is present during the interval $t_w$, it cannot be reliable detected for technical reasons. If one therefore intends to reconstruct an image from the detectable signal portions, information concerning the first data points following the excitation pulse 6 is missing in each projection due to the waiting time $t_w$. One can attempt to artificially complement these points, in general, through extrapolation. This, however, leads to significant problems and errors in the reconstruction.

FIG. 2 shows how these missing measuring points can be complemented through additional measurements. An excitation pulse 6 is once more shown. The waiting time $t_w$, subsequent thereto, is largely determined by the apparatus. This time is preferentially an odd multiple of half of the so-called "dwelltime" (DW) which determines the cycling time of the data acquisition. The signal is read out and digitalized (hatched region) with this cycling time (DW). All data points necessary for a projection ($S_4$ and the following), with the exception of those occurring in the time interval $t_w$ ($S_1$ through $S_3$), are taken with a single excitation. Towards this end, the maximum gradient 3 is present in FIG. 2. In order to complete the projection an additional data point ($S_3$) is recorded with a second excitation having reduced gradients 33 after the time $t_w$. This data point corresponds to one which would have been recorded in the original excitation within interval $t_w$ and although the relative measuring point time is increased to $t_w$, the effective gradient has been correspondingly reduced so that the dephasing is correct. However, there are differences with regard to relaxation effects which one has to accept. One acts in a corresponding fashion when taking the remaining data points ($S_1$ through $S_2$). The sequence of the measurements does not matter. It is also possible, if allowed by the waiting time, to partially measure a plurality of data points with the same excitation as long as the corresponding time points lie near or outside $t_w$. It is also possible, in order to improve the signal to noise S/N ratio, to take additional data at later relative times and to overlap these with those already measured (which have the same dephasing). In this fashion one mixes more data having different relaxation effects which, depending on the application, could, in fact, be desirable.

It is possible to increase the waiting time $t_w$ beyond the minimum value required for technical reasons in order to intentionally vary the influences of the relaxation time $T_2$.

FIG. 3 shows the position of the measuring points in k-space for the two-dimensional case of the conventional projection reconstruction (PR) method. They lie on concentric equidistant arcs about k=0. Each arc contains the same number of measuring points, i.e. the density of the points in k-space decreases with increasing magnitude of k. With the conventional PR method a magnetic field, with constant magnitude, is present under the influence of which, in correspondence with FIG. 1 or FIG. 2, data are recorded which correspond to measuring points along a fixed radius vector in k-space. The gradient is then rotated and another "projection" is taken. This occurs in a plane, in general, over at least 180°. The method can be extended to three dimensions through corresponding increase in the number of projections and therewith the entire measuring time.

In methods in accordance with the invention the measuring points can be taken along each projection as described above. In an application in connection with the SPI method, the measuring points on the i' innermost circle can be taken separately with changed gradient strengths.

Figure 4:
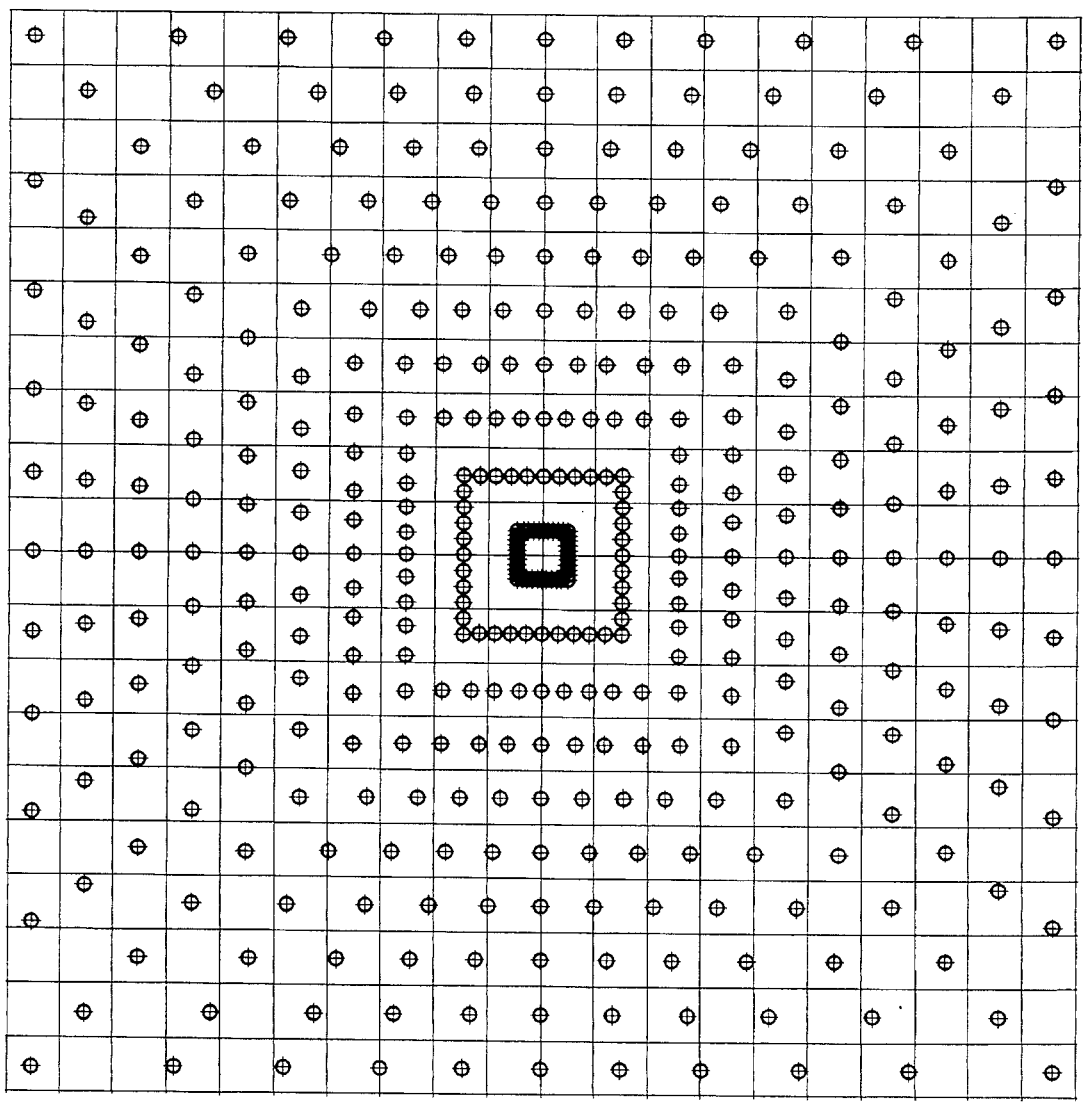
FIG. 4 shows a method with variable gradient strength and position of the measuring points on the sides of squares.

FIG. 4 shows, analogous to FIG. 3, the position of the measuring points for a modified method with which the projection methods are largely maintained during excitation and data recording, i.e. n projections are taken in a plane which differ from each other by a fixed angle increment $\Delta\phi$. The gradient strength is, however, changed from projection to projection so that the measuring points no longer lie on circular arcs, rather on the sides of squares. The number of measuring points per projection remains, in general, constant. The gradient strength, in dependence on the angle of rotation $\phi$, has magnitude $$|G(\phi)| = \left| \frac{G(0)}{\cos(\phi)} \right| \quad 0 \leq \phi \leq 45°$$

This leads to the fact that a square, rather than a circular area, is filled with data points. Otherwise the data acquisition occurs as described in connection with FIGS. 2 and 3. Extension to three dimensions is furthermore possible which leads to a cube, parallelepiped-shaped, or cylinder-shaped coverage in k-volume.

For the production of an image from measuring data, it is however, as already mentioned above, desirable for the measuring points in k-space to lie on equidistant points in a Cartesian coordinate system. In this case the so-called 2d-FT or 3d-FT algorithm can, namely, be directly utilized for the reconstruction, which is by far currently most frequently utilized and, in general, produces images free from artifacts (see for example the above mentioned book of Morris, § 4.2) and, in particular with three-dimensional images, offers substantial speed advantages. This is particularly important when this portion of the measurement determines the total measurement time within which an image is available.

The k-plane is, in each case, subdivided into 20*20=400 small squares in FIGS. 3 and 4, and 40 projections with 10 data points each, i.e. 400 data points are measured. In order to map into a configuration which is suitable for the FT-algorithm, the (in the simplified example) 400 measured data points must be assigned to the 400 Cartesian grid coordinates. Clearly, this is easier to do in FIG. 4 than in FIG. 3.

In the following several methods will be described with which this mapping can take place in a reasonable fashion.

A very simple but, in many cases, perfectly adequate version is to assign a point to each square in which exactly one point lies. Should more than one point lie within a square then either an average value is formed or only that point is utilized which is closer to the center of the square. Should a square contain no measuring points, it is assigned the value zero. ("Zero" can also correspond to a "base line" which deviates from exactly zero, e.g. an off set correction which does not directly have anything to do with the actual measuring procedure but can, as previously, be accommodated.) The zero approximation is not a bad one, since such "empty" squares are only present at the edge of the measuring region, e.g. at large k-values or at long times following the excitation, where the signal has already died off.

Each square in the plane represents a k-vector which extends from k=0 to the center of a square. Instead of the simple mapping, a weighted average of a plurality of points in the square itself or from the neighboring squares can be mapped to a square, which of course increases the computer requirements.

In order to prevent the occurrence of "empty" squares the number of projections can also be increased so that at least one point lies in each of the small peripheral squares over the entire extent of the square region spanned in k-space.

That which has been mentioned above can be logically extended to three dimensions, whereby the squares become cubes or also segments of hollow cylinders.

Figure 5:
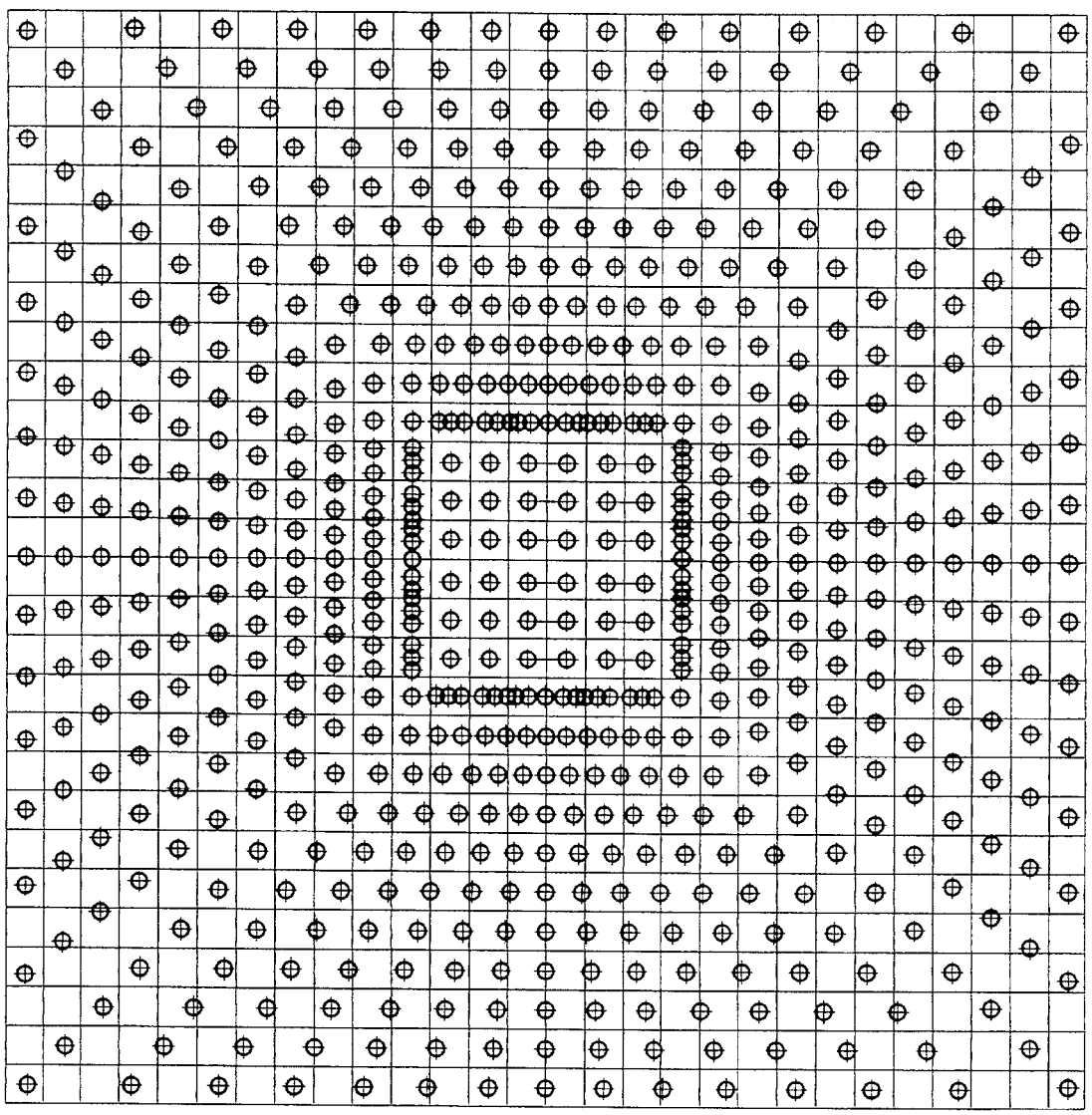
FIG. 5 shows the position of measuring points on the sides of squares in two dimensional k-space with a modified method having reduced measuring point density for small k-values.

One sees from FIG. 4 that the point density is quite high in the vicinity of k=0. If then the measuring points in the vicinity of the innermost squares are, in any event, measured with separate excitations and if one attempts to map into a Cartesian coordinate, it is possible to drastically reduce the number of measuring points in this inner region or to intentionally separately record the measuring points in the center of the initially reserved squares using "single point imaging". This is represented in FIG. 5. With the 40 projections having an original total of 400 measuring points, the first three measuring points are, in each case, eliminated (a total of 40*3=120), since they lie within the waiting time $t_w$. They are replaced by 6*6=36 individual point recordings with reduced gradient values. The entire number of data points in this example is reduced to 280+36=316, to cause a significant time advantage and without disadvantages, since a sufficient number of points for reconstruction are still available in the vicinity of k=0.

Clearly, this method can be extended to three dimensions.

The examples of the figures only utilize a few projections and data points for reasons of clarity. Clearly, this is not intended in any fashion to represent a limitation. Usually, one works in a plane having 128 or 256 projections and digitalizes exactly as many measuring points per projection. These numbers are adapted to the experimental conditions.

The method in accordance with the invention can be integrated into any measurement for the production of images using magnetic resonance which utilizes a projection method on the excitation side and with which a projection gradient direction is changed from excitation to excitation. The details of the taking of the measuring data between excitations can be solved in varying ways, for example, by measurements of the direct FID of a gradient or a spin echo. If appropriate, the method can be also combined with complicated imaging methods as a block or integrated therein. An example thereof is combination with the so-called above mentioned SPI method which is the object of a parallel application by this applicant filed with the same filing date.

We claim:

1. A magnetic resonance method for imaging at object comprising the steps of:
    a) locating the object in a homogeneous base magnetic field;
    b) applying a gradient magnetic field having a predetermined direction $\phi$ and strength G$\phi$ for acquiring a single projection;
    c) irradiating a high frequency excitation pulse into the object;
    d) waiting a time $t_w$;
    e) measuring, at a predetermined sampling rate, j>>1 measuring points Sj which are sequential in time of a nuclear resonance signal from the object, the signal dephasing under the influence of the gradient magnetic field, the measuring points corresponding to i points in k-space lying along a vector extending from a k-space origin in a direction determined by the direction $\phi$ of the gradient magnetic field, whereby separation of each of the i points in k-space from the k-space origin is given by a product of the Strength of the gradient magnetic field and a time interval between the excitation pulse and the jth measuring point $S_j$;
    f) changing the strength and the direction of the gradient magnetic field;
    g) carrying out the steps c) through f) an additional n-times for acquiring n projections with n>>1;
    h) assigning new points in k-space from the n*i points in k-space,
    i) constructing an image from the new points in k-space using one of a 2d and a 3d Fourier transformation algorithm.

2. The method of claim 1, wherein the gradient magnetic field is changed in such a fashion that all points in k-space lie on one of rectangles and concentric squares.

3. The method of claim 1, wherein the gradient magnetic field is changed in such a fashion that all points in k-space lie on one of surfaces of cylinders nested within each other and on surfaces of cubes.

4. The method of claim 1, wherein step h) comprises the steps of:
    defining one of a rectangular and a parallelepiped-shaped measuring region in k-space;
    subdividing the measuring region into one of equally sized rectangles and parallelepipeds having centers;
    assigning new points in k-space to each center.

5. The method of claim 4, wherein the new points in k-space are assigned by determining that point in k-space closest to each center of one of each equally sized rectangle and each equally sized parallelepiped and by setting the new point in k-space equal to zero if no point in k-space lies within one of the equally sized rectangle and the equally sized parallelepiped.

6. The method of claim 4, wherein the new points in k-space are assigned by calculating an average value of all points in k-space located within one of the equally sized rectangle and the equally sized parallelepiped, whereby each new point in k-space is set equal to zero if no point in k-space lies within one of the equally sized rectangle and the equally sized parallelepiped.

7. The method of claim 4, wherein the new points in k-space are assigned by calculating an average value, weighted with a distance from each center, of all points in k-space located within one of the equally sized rectangle and the equally sized parallelepiped, whereby each new point in k-space is set equal to zero if no point in k-space lies within one of the equally sized rectangle and the equally sized parallelepiped.

8. The method of claim 4, wherein the new points in k-space are assigned by fitting one of the points in k-space and the measuring points to a fitting function.

9. The method of claim 4, wherein the gradient strength and direction are adjusted in such a fashion that each of one of the equally sized rectangles and equally sized parallelepipeds contains at least one point in k-space.

10. A magnetic resonance method for imaging an object comprising the steps of:
    a) locating the object in a homogeneous base magnetic field;

b) applying a gradient magnetic field having a predetermined direction P and strength Gφ for acquiring a single projection;

c) irradiating a high frequency excitation pulse into the object;

d) waiting a time tw;

e) measuring, at a predetermined sampling rate, j>>1 measuring points Sj which are sequential in time of a nuclear resonance signal from the object, the signal, dephasing under the influence of the gradient magnetic field, the measuring points corresponding to i points k-space lying along a vector extending from a k-space origin in a direction determined by the direction t of the gradient magnetic field, whereby separation of each of the points in k-space from the k-space origin is given by a product of the strength of the gradient magnetic field and a time interval between the excitation pulse and the jth measuring point Sj;

f) changing the strength and the direction of the gradient magnetic field;

g) carrying out the steps c) through f) an additional n−1 times for acquiring n projections with n>>1;

h) assigning new points in k-space from the n*i points in k-space by defining one of a rectangular and a parallelepiped-shaped measuring region in k-space, subdividing the measuring region into one of equally sized rectangles and parallelepipeds having centers, and assigning new points in k-space to each center;

i) constructing an image from the new points in k-space using one of a 2d and a 3d Fourier transformation algorithm.

11. A magnetic resonance method for imaging an object comprising the steps of:

a) locating the object in a homogeneous base magnetic field;

b) applying a gradient magnetic field having a predetermined direction t and strength Gφ for acquiring a single projection;

c) irradiating a high frequency excitation pulse into the object;

d) waiting a time tw;

e) measuring, at a predetermined sampling rate, j>>1 measuring points Sj which are sequential in time of a nuclear resonance signal from the object, the signal dephasing under the influence of the gradient magnetic field, the measuring points corresponding to i points in k-space lying along a vector extending from a k-space origin in a direction determined by the direction t of the gradient magnetic field, whereby separation of each of the i points in k-space from the k-space origin is given by a product of the strength of the gradient magnetic field and a time interval between the excitation pulse and the jth measuring point Sj;

f) changing the strength and the direction of the gradient magnetic field;

g) carrying out the steps c) through f) an additional n−1 times for acquiring n projections with n>>1;

h) assigning new points in k-space from the n*i points in K-space by defining one of a rectangular and a parallelepiped-shaped measuring region in k-space, subdividing the measuring region into one of equally sized rectangles and parallelepipeds having centers, and assigning new points in k-space to each center, wherein the gradient strength and direction are adjusted in such a fashion that each equally sized rectangles and equally sized parallelepipeds contains at least one point in K-space;

i) constructing an image from the new points in k-space using one of a 2d and a 3d Fourier transformation algorithm.

* * * * *